US006251762B1

(12) United States Patent
Jan et al.

(10) Patent No.: US 6,251,762 B1
(45) Date of Patent: Jun. 26, 2001

(54) METHOD AND DEVICE FOR IMPROVED SALICIDE RESISTANCE ON POLYSILICON GATES

(75) Inventors: Chia-Hong Jan, Portland; Julie A. Tsai, Beaverton; Simon Yang, Portland; Tahir Ghani, Beaverton; Kevin A. Whitehill, Portland; Steven J. Keating, Beaverton; Alan Myers, Portland, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/458,572

(22) Filed: Dec. 9, 1999

(51) Int. Cl.$^7$ .................... H01L 21/3205; H01L 21/4763
(52) U.S. Cl. .......................... 438/592; 438/301; 438/303; 437/41; 437/27; 437/200; 257/384; 257/412
(58) Field of Search ................................ 438/592; 437/41

(56) References Cited

U.S. PATENT DOCUMENTS

| 4,716,131 | 12/1987 | Okazawa et al. . |
| 4,876,213 | 10/1989 | Pfiester . |
| 4,912,061 | 3/1990 | Nasr . |
| 4,981,810 | * 1/1991 | Fazan et al. ............................. 437/44 |
| 5,290,720 | 3/1994 | Chen ...................................... 437/41 |
| 5,573,965 | 11/1996 | Chen et al. . |
| 5,696,012 | 12/1997 | Son . |
| 5,726,479 | 3/1998 | Matsumoto et al. . |
| 5,739,573 | 4/1998 | Kawaguchi . |
| 5,783,475 | 7/1998 | Ramaswami . |
| 5,783,479 | 7/1998 | Lin et al. . |
| 5,882,973 | 3/1999 | Gardner et al. . |
| 5,920,783 | 7/1999 | Tseng et al. . |
| 6,071,782 | 6/2000 | Maa et al. ............................. 438/301 |

OTHER PUBLICATIONS

Nakayama, T., et al., "Excellent Process Control Technology for Highly Manufacturable and High Performance 0.18 mm CMOS LSIs" 1998 IEEE, 1998 Symposium on VLSI Technology Digest of Technical Papers, pp. 146–147.
International Search Report, PCT/US 99/ 22175, Nov. 4, 1999.

* cited by examiner

Primary Examiner—Richard Booth
Assistant Examiner—Olivia Luk
(74) Attorney, Agent, or Firm—Blakely, Sokoloff, Taylor & Zafman LLP

(57) ABSTRACT

A method and device for improved salicide resistance in polysilicon gates under 0.20 $\mu$M. The several embodiments of the invention provide for formation of gate electrode structures with recessed and partially recessed spacers. One embodiment, provides a gate electrode structure with recessed thick inner spacers and thick outer spacers. Another embodiment provides a gate electrode structure with recessed thin inner spacers and recessed thick outer spacers. Another embodiment provides a gate electrode structure with thin inner spacers and partially recessed outer spacers. Another embodiment provides a gate electrode structure with two spacer stacks. The outermost spacer stack with recessed thin inner spacers and recessed thick outer spacers. The inner spacer stack with thin inner spacers and thin outer spacers. Another embodiment provides a gate electrode structure with two spacer stacks. The outermost spacer stack with recessed thin inner spacers and recessed thick outer spacers. The inner spacer stack with recessed thin inner spacers and recessed thin outer spacers.

11 Claims, 10 Drawing Sheets

METHOD AND DEVICE FOR IMPROVED SALICIDE RESISTANCE ON POLYSILICON GATES

FIELD OF THE INVENTION

The present invention relates to the field of semiconductor devices. More particularly, the present invention relates to a method and device for improved resistance on gate electrodes. Specifically, the present invention relates to a method and device for improved salicide resistance on polysilicon gates.

BACKGROUND OF THE INVENTION

Transistors are commonly used in semiconductor circuitry to control current flow. For example, a transistor can be used as a switching mechanism to allow the flow of current between a source and a drain region in a circuit when a certain threshold voltage is met. Transistors generally include a gate electrode that allows or prevents the flow of current in the transistor based on applied voltage.

FIG. 1a shows a cross-sectional view of a conventional gate electrode 100 formed on a substrate 110, the underlying structure of which is not shown. It should be noted that the figures are merely illustrative and have been simplified for clarity purposes. A thin insulative layer 120 is formed on the substrate 110 to act as a barrier between the substrate 110 and the conductive portions of the gate electrode 100. An example of an insulative layer 120 can be an oxide layer, such as silicon dioxide ($SiO_2$). Formed on the insulative layer 120 is a gate layer 130. An example of a gate layer 130 can be a polysilicon layer. Formed on the gate layer 130 is a conductive layer 160. An example of a conductive layer 160 can be a polycide layer, such as titanium salicide ($TiSi_2$). When a threshold voltage is applied to the gate layer 130 by the conductive layer 160, current will flow through the gate layer 130. Often insulative spacers 140 and 150 are formed to each side of the gate layer 130 to prevent transfer of current between the gate layer 130 and surrounding structures in the semiconductor.

In semiconductor circuit design, frequently, gate electrodes are designed in long continuous lines on the semiconductor substrate to efficiently provide current to several transistors in a circuit. Currently, improved semiconductor transistor performance is being achieved through device scaling in which the gate layer widths are being reduced from 0.20 μm to 0.15 μm and below (sub-0.15 μm). As the gate layer width dimensions decrease, so do the conductive layer line widths formed above them.

When the gate layer widths decrease below 0.20 μμm, current process techniques produce conductive lines with sharply increasing resistance. This is detrimental to the efficiency of the semiconductor, as higher resistance decreases the speed of the semiconductor circuitry. Additionally, process yields drop due to defective conductive line formation reducing manufacturing output. These problems have been particularly noted in current fabrication processes where titanium salicide ($TiSi_2$) is formed as the conductive layer in a polysilicon gate.

FIG. 1b illustrates a cross-sectional view of a conventional gate electrode 100 formed on a substrate 110, the underlying structure of which is not shown. An example of a gate electrode 100 can be a polysilicon gate electrode. Formed on the substrate 110 is an insulative layer 120. An example of an insulative layer 120 can be an oxide. Formed on the insulative layer 120 is a conductive gate layer 130. An example of a gate layer 130 is a polysilicon layer. Formed on the gate layer 130 is a conductive layer 160. An example of a conductive layer 160 can be a polycide, such as titanium salicide. Insulative spacers 140 and 150 are formed adjacent to the gate layer 130 and conductive layer 160 to prevent current flow between the gate layer 100 and surrounding structures.

During formation of the conductive layer 160, components from underlying gate layer 130 often out diffuse into a reactant layer that is used to form the conductive layer 160. For example, silicon components of an underlying gate layer 130 may out diffuse into the conductive layer 160. This out diffusion results in a conductive layer 160 wider than the gate layer 130. When the gate layer 100 width is decreased below 0.20 μm, the conductive layer 160 becomes stressed by its enclosure between the side walls of the spacers 140. This results in increased resistance in the conductive layer 160. Increased resistance in the conductive layer directly impacts the quality of the semiconductor circuit. The circuit becomes inefficient and circuit failure or device failure may occur.

Another result of decreasing the gate line widths below 0.20 μm is a decrease in process yields. This is due to non-formation of the conductive layer. This is attributed to the reduced reaction area, or nucleation sites, available at such small dimensions. The reduced dimensions of the gate layer reduces nucleation sites on which the conductive layer can form during processing. Using current process techniques, if sufficient nucleation sites are not provided, the conductive layer often won't form. This directly impacts the semiconductor manufacturer by reducing output.

Based on the above described problems, it would be desirable to have a method and/or device which will improve the polycide resistance in polysilicon gate widths below 0.20 μm.

BRIEF SUMMARY OF THE INVENTION

The present invention provides a method and a device which improves polycide resistance in gate electrode widths below 0.20 μM. The invention provides several embodiments one embodiment of which is described below.

In one embodiment of the present invention there is provided a gate electrode comprising a thin insulative layer. A gate layer is formed on the thin insulative layer. A conductive layer is formed on the gate layer. Thick first spacers are formed adjacent to opposite sides of the gate layer. Thick second spacers are formed adjacent to the thick first spacers. The thick first spacers are recessed to create an open space between the gate layer and thick second spacers.

BRIEF DISCUSSION OF THE SEVERAL VIEWS OF THE DRAWINGS

For fuller understanding of the present invention, reference is made to the accompanying drawings in the following detailed description of the invention. In the drawings.

FIGS. 2(a)–(h) are cross-sectional illustrations of the formation of a gate electrode with a conductive layer and recessed thick inner spacers and non-recessed thick outer spacers.

FIGS. 3(a)–(i) are cross-sectional illustrations of the formation of a gate electrode with a conductive layer and recessed thin inner spacers and recessed thick outer spacers.

FIGS. 4(a)–(i) are cross-sectional illustrations of the formation of a gate electrode with a conductive layer and non-recessed thin inner spacers and partially recessed outer spacers.

FIGS. 5(a)–(m) are cross-sectional illustrations of the formation of a gate electrode with a conductive layer and two spacer stacks. The outermost spacer stack having recessed thin inner spacers and recessed thick outer spacers. The inner spacer stack having non-recessed thin inner spacers and non-recessed thin outer spacers.

Figure 6A:
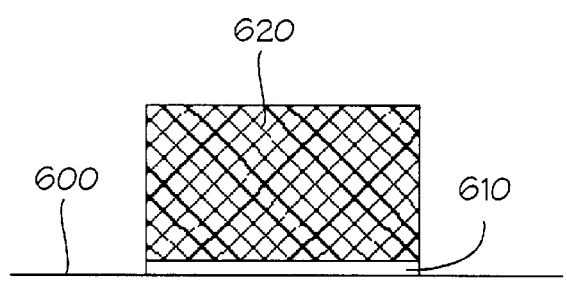
Figure 6B:
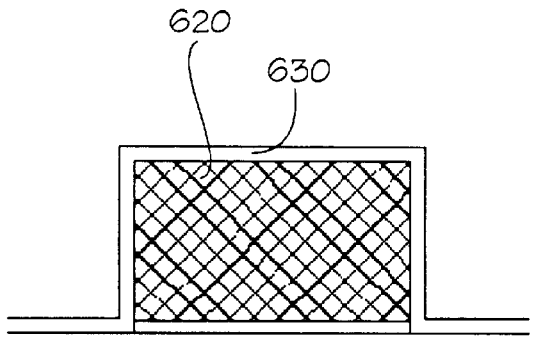
Figure 6C:
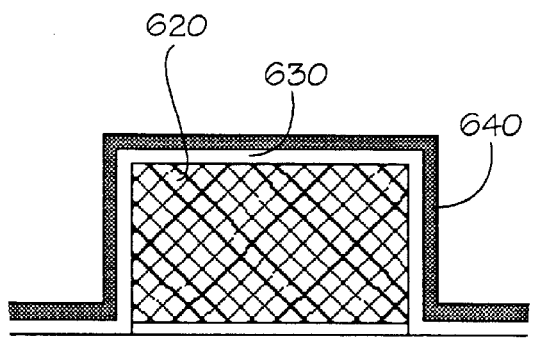
Figure 6D:
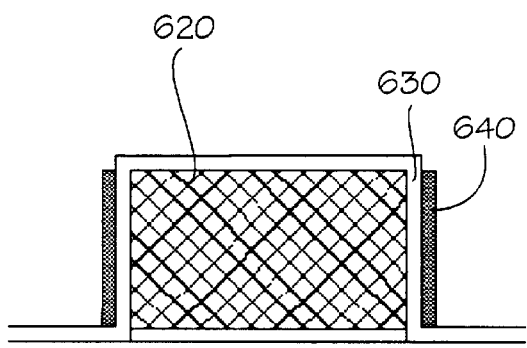
Figure 6E:
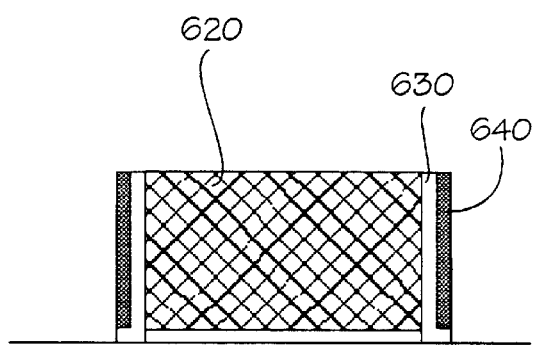
Figure 6F:
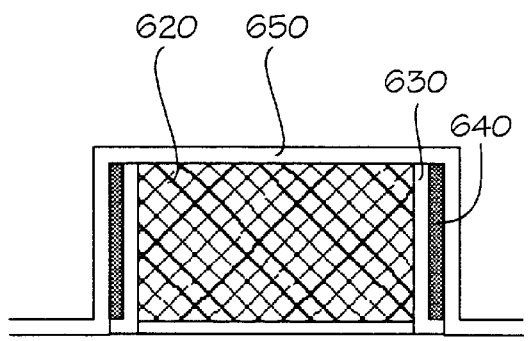
Figure 6G:
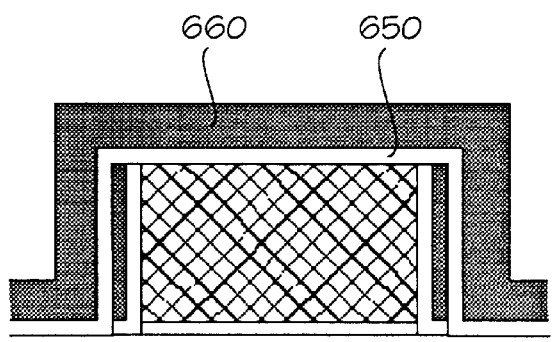
Figure 6H:
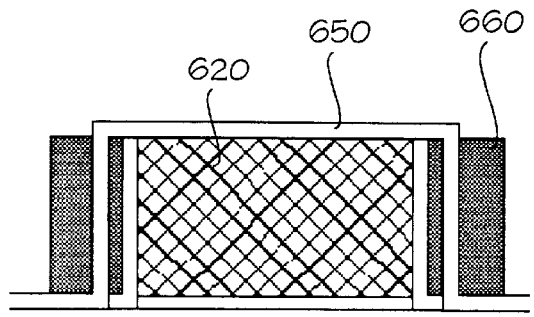
Figure 6I:
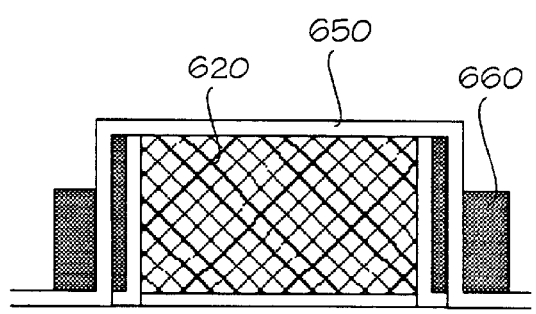
Figure 6J:
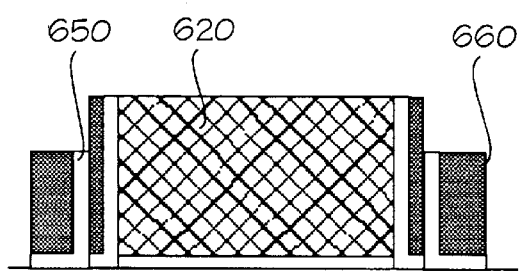
Figure 6K:
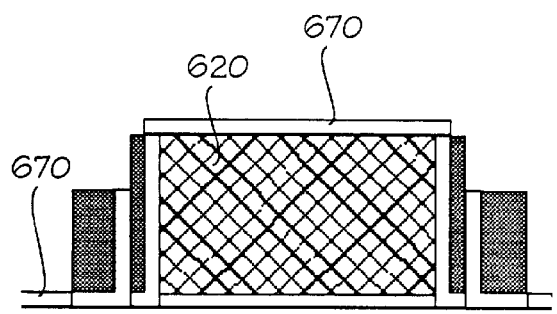
Figure 6L:
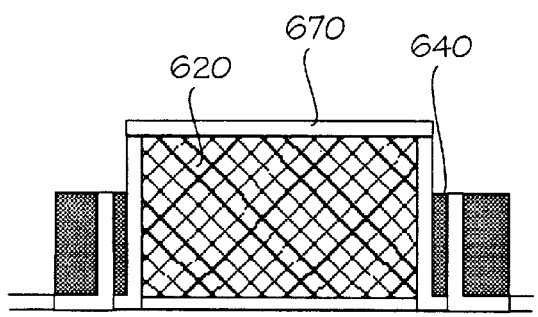
Figure 6M:
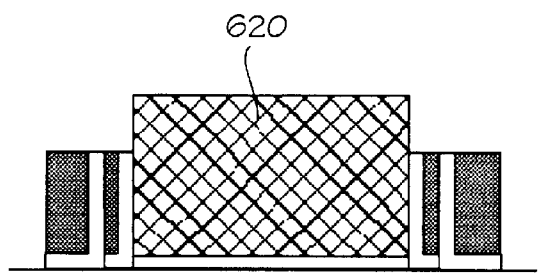
Figure 6N:
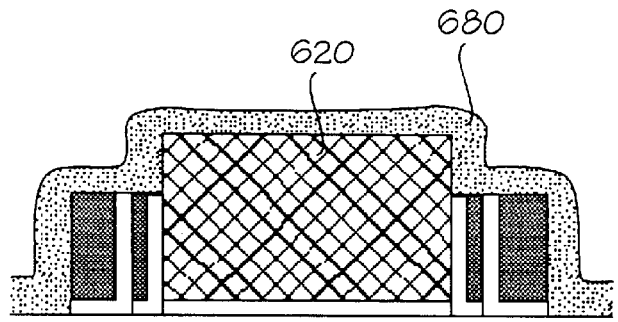
Figure 6O:
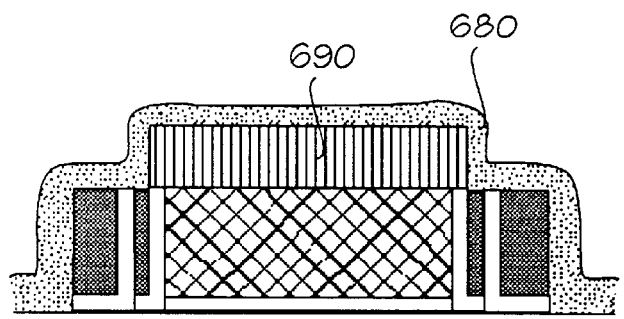
Figure 6P:
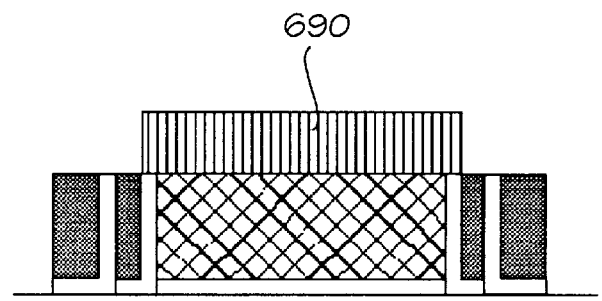

FIGS. 6(a)–(p) are cross-sectional illustrations of the formation of a gate electrode with a conductive layer and two spacer stacks. The outermost spacer stack having recessed thin inner spacers and recessed thick outer spacers. The inner spacer stack having recessed thin inner spacers and recessed thin outer spacers.

DETAILED DESCRIPTION OF THE INVENTION

The present invention provides a method and a device to improve polycide resistance on gate electrodes less than 0.20 μm in width. In the following description of the several embodiments of the invention, numerous details are set forth in order to provide a thorough understanding of the present invention. It will be appreciated by one having ordinary skill in the art that the present invention may be practiced without such specific details. In other instances, well known structures and techniques have not been described in detail in order to avoid obscuring the subject matter of the present invention. It will be understood by those having ordinary skill in the art that the structures of the present invention may be formed by various techniques.

Figure 1A:
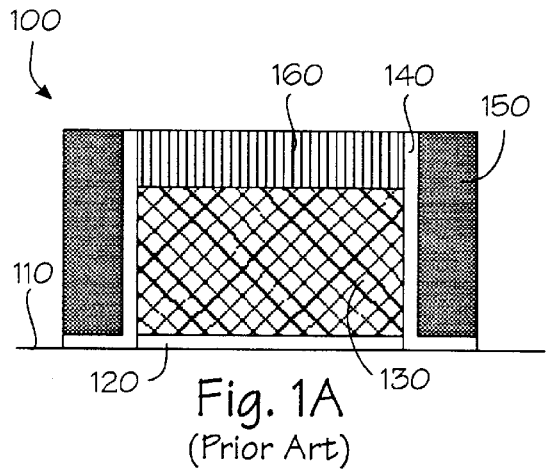
FIG. 1(a) is a cross-sectional illustration of a conventional gate electrode in the prior art depicting a non-stressed conductive layer.
Figure 1B:
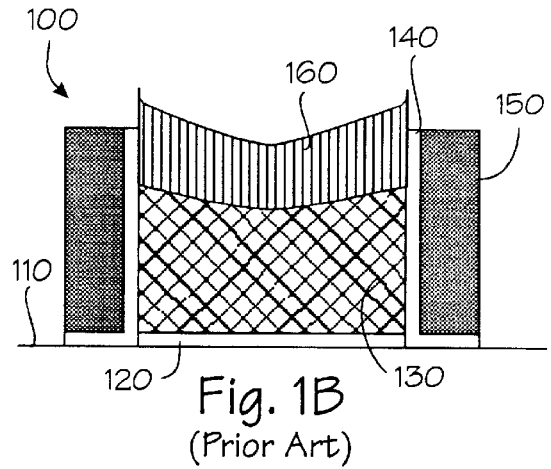
FIG. 1(b) is a cross-sectional illustration of a conventional gate electrode in the prior art depicting a stressed conductive layer.
Figure 2A:
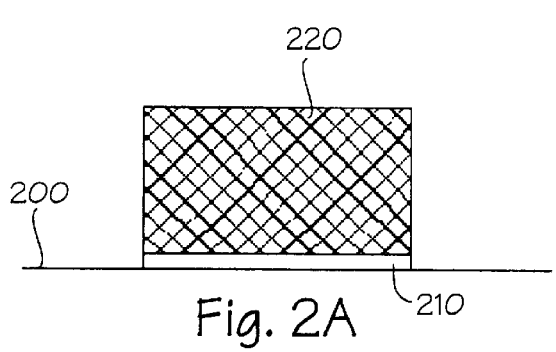

Referring now to the drawings, one embodiment of the present invention is shown in FIGS. 2a–h. FIG. 2a illustrates a gate layer 220 formed on a thin insulative layer 210 on a substrate 200. In one embodiment, the gate layer 220 can be a polysilicon. In one embodiment, the gate layer 220 is less than 0.20 μm in width. These structures are formed using conventional deposition and etching techniques well-known in the art.

Figure 2B:
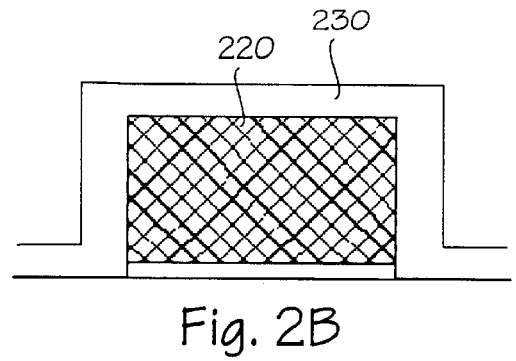

In FIG. 2b, a thick first spacer layer 230 is deposited or grown on the gate layer 220 and substrate 200. In one embodiment, the thick first spacer layer 230 can be an oxide. In one embodiment, the thick first spacer layer 230 can be deposited or grown to a thickness in the range of approximately 200–600 Å, for example, 300 Å. It should be noted that the thick first spacer layer 230 can be deposited or grown using deposition techniques that are well known in the art and are not described in detail herein.

Figure 2C:
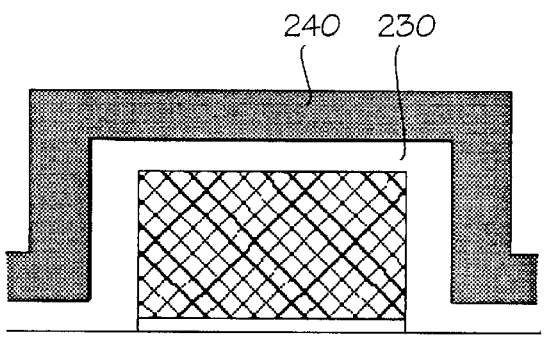

In FIG. 2c, a thick second spacer layer 240 is deposited or grown on the thick first spacer layer 230. In one embodiment, the thick second spacer layer 240 can be a nitride. In one embodiment, the thick second spacer layer 240 can be deposited or grown to a thickness in the range of approximately 300–2000 Å, for example, 800 Å. It should be noted that the thick second spacer layer 240 can be deposited or grown using deposition techniques that are well known in the art and are not described in detail herein.

Figure 2D:
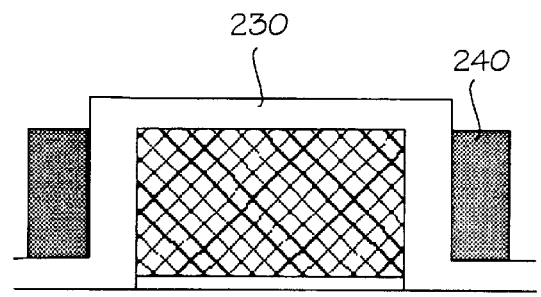

The thick second spacer layer 240 is etched to form the spacer structure illustrated in FIG. 2d. In one embodiment, this etch is an anisotropic (directional) etch which will remove nitride, but not oxide. Examples of anisotropic etches are a dry etch or a plasma etch.

Figure 2E:
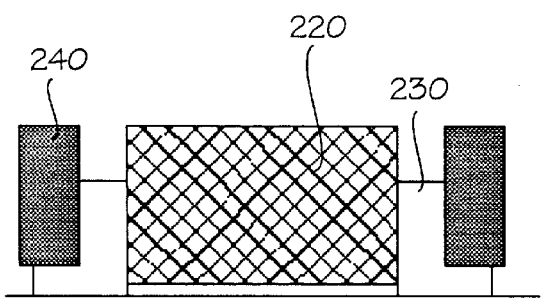

The thick first spacer layer 230 is recessed by etching to form the spacer structure illustrated in FIG. 2e. The recessing creates an open space between the thick second spacer layer 240 and the gate layer 220. In one embodiment, the thick first spacer layer 230 is etched approximately 60 nm deeper than the surface of the gate layer 220. In one embodiment, the etching forms a space approximately 200–600 Å, for example, 300 Å, between the thick second spacer layer 240 and the gate layer 220. In one embodiment this etch is an isotropic (multidirectional) etch which will remove oxide, but not nitride. Examples of isotropic etches are dry or wet etches. It should be noted that the side walls of the gate layer 220 are now exposed creating a larger contact (reaction) surface area.

Figure 2F:
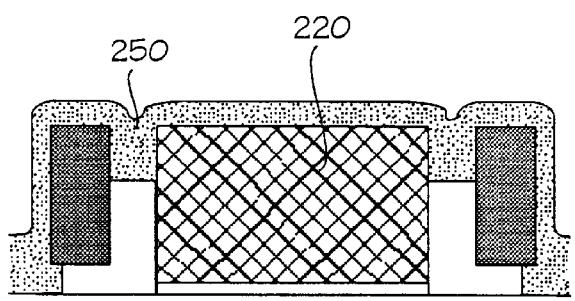

In FIG. 2f, a reactant layer 250 is deposited, for example by sputter, electron beam evaporation, chemical vapor, or plasma deposition. In one embodiment, the reactant layer 250 can be a metal, such as titanium.

Figure 2G:
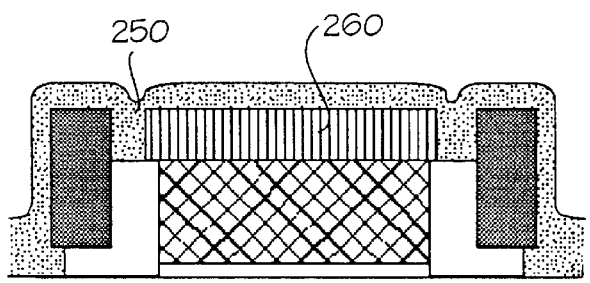

The reactant layer 250 and the gate layer 220 are then annealed to form a conductive layer 260 as shown in FIG. 2g. In one embodiment, the formed conductive layer 260 can be a polycide, such as titanium salicide. A polycide may also be called a polysilicide. It should be noted that silicides can be self-aligning or non-self-aligning, and if the silicides is self-aligning, it may be called a salice. It is to be understood by one of ordinary skill in the art that polycides, other than self-aligning silicides, may also be formed. In one embodiment, the anneal may be performed using a rapid thermal annealing process in a nitrogen ambient. In one embodiment, additional anneals can be performed to decrease the resistance of the conductive layer 260. It is to be noted that the conductive layer 260 can now extend beyond the edges of the gate layer 220 and is not constrained and stressed by the thick first spacer layer 230.

Figure 2H:
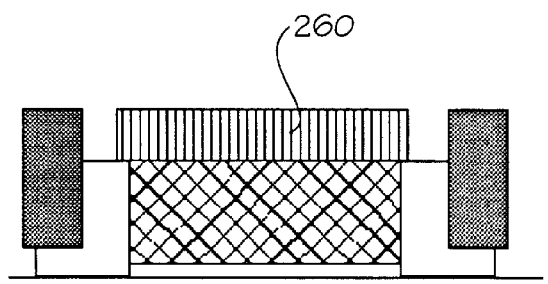

The unreacted portion of reactant layer 250 is etched away leaving the conductive layer 260 as illustrated in FIG. 2h. In one embodiment, this etch is an isotropic etch which will remove unreacted titanium, but not titanium salicide.

Figure 3A:
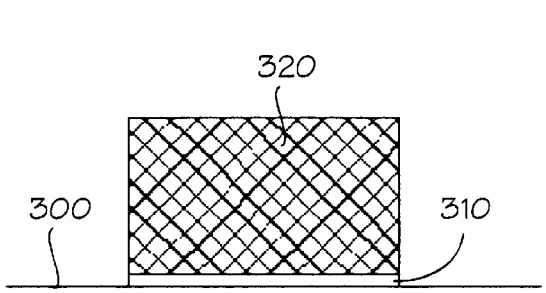

Another embodiment of the present invention is illustrated in FIGS. 3a–i. FIG. 3a illustrates a gate layer 320 formed on a thin insulative layer 310 on a substrate 300. In one embodiment, the gate layer 320 can be a polysilicon. In one embodiment, the gate layer 320 is less than 0.20 μm in width. These structures are formed using conventional deposition and etching techniques well-known in the art.

Figure 3B:
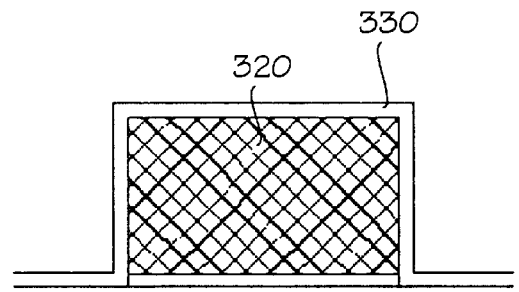

In FIG. 3b, a thin first spacer layer 330 is deposited or grown on the gate layer 320 and substrate 300. In one embodiment, the thin first spacer layer 330 can be an oxide. In one embodiment, the thin first spacer layer 330 is deposited or grown to a thickness in the range of approximately 50–300 Å, for example, 100 Å. It should be noted that the thin first spacer layer 330 can be deposited or grown using deposition techniques that are well known in the art and are not described in detail herein.

Figure 3C:
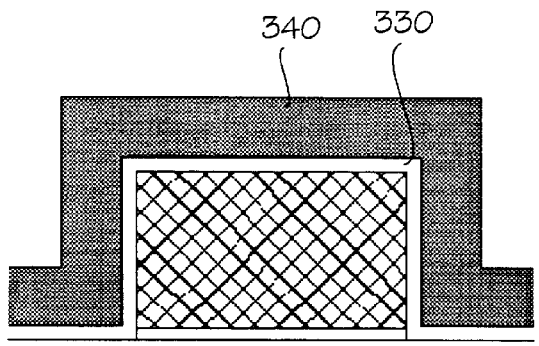

In FIG. 3c, a thick second spacer layer 340 is deposited or grown on the thin first spacer layer 330. In one embodiment, the thick second spacer layer 340 can be a nitride. In one embodiment, the thick second spacer layer 340 is deposited or grown to a thickness in the range of approximately 300–2000 Å, for example, 800 Å. It should be noted that the thick second spacer layer 340 can be deposited or grown using deposition techniques that are well known in the art and are not described in detail herein.

Figure 3D:
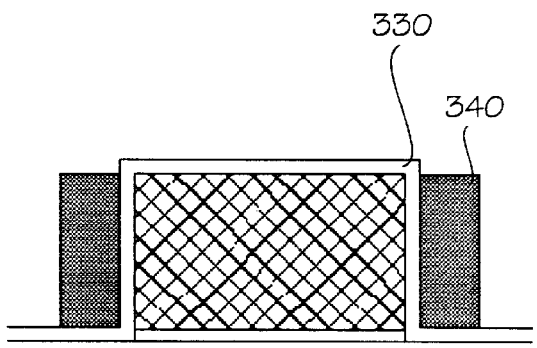

The thick second spacer layer 340 is etched a first time to form the structure illustrated in FIG. 3d. In one embodiment, this etch is an anisotropic (directional) etch which will remove nitride, but not oxide. Examples of anisotropic etches are a dry etch or a plasma etch.

Figure 3E:
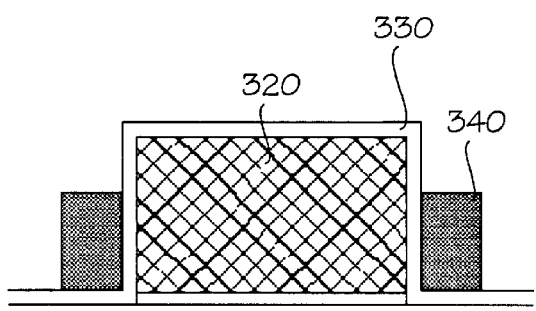

The thick second spacer layer 340 is then recessed by etching a second time to form the spacer structure illustrated in FIG. 3e. In one embodiment, the thick second spacer layer 340 is etched approximately 60 nm deeper than the surface level of the gate layer 320. In one embodiment, this etch is an isotropic (multidirectional) etch which will remove nitride, but not oxide. Examples of isotropic etches are a wet or dry etch.

Figure 3F:
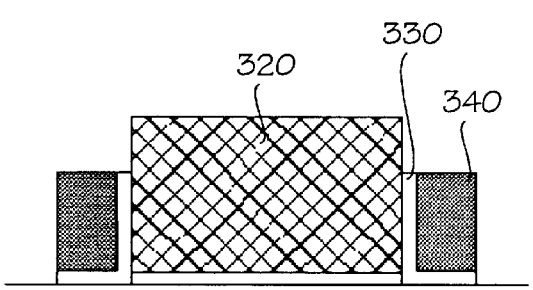
Figure 3G:
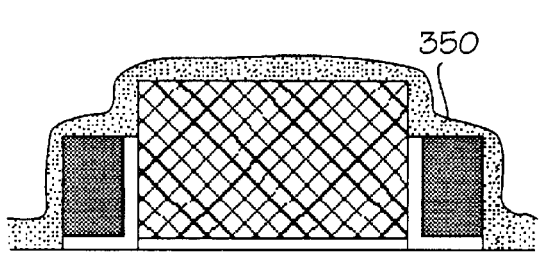

The thin first spacer layer 330 is then recessed by etching to form the spacer structure illustrated in FIG. 3f. In one embodiment, this etch is an isotropic (multidirectional) etch which will remove oxide, but not nitride. Examples of isotropic etches are a dry, wet or chemical bath etch. It should further be noted that the side walls of the gate layer 320 are now exposed creating a larger contact (reaction) surface area In FIG. 3g, a reactant layer 350 is deposited, for example, by sputter, electron beam evaporation, chemical vapor, or plasma deposition. In one embodiment, the reactant layer 350 can be a metal, such as titanium.

Figure 3H:
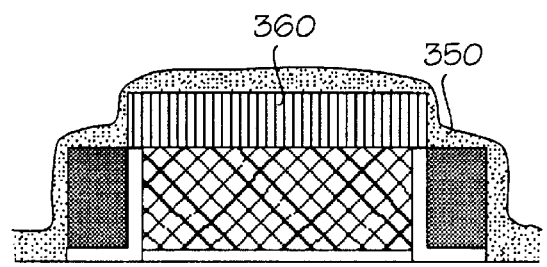

The reactant layer 350 and the gate layer 320 are then annealed to form a conductive layer 360 as shown in FIG. 3h. In one embodiment, the formed conductive layer 360 can be a polycide, such as titanium salicide. A polycide may also be called a polysilicide. It should be noted that silicides can be self-aligning or non-self-aligning, and if the silicide is self-aligning, it may be called a salicide. It is to be understood by one of ordinary skill in the art that polycides, other than self-aligning silicides, may also be formed. In one embodiment, the anneal may be performed using a rapid thermal annealing process in a nitrogen ambient. In one embodiment, additional anneals can be performed to decrease the resistance of the conductive layer 360. It is to be noted that the conductive layer 360 can now extend beyond the edges of the gate layer 320 and is not constrained and stressed.

Figure 3I:
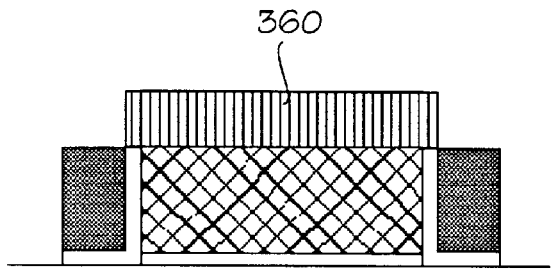

The unreacted portion of reactant layer 350 is etched away leaving the conductive layer 360 as illustrated in FIG. 3i. In one embodiment, this etch is an isotropic etch which will remove unreacted titanium, but not titanium salicide.

Figure 4A:
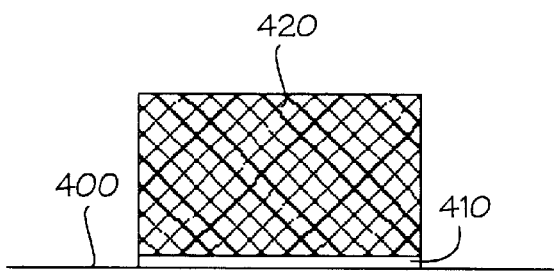

Another embodiment of the present invention is illustrated in FIGS. 4a–i. FIG. 4a illustrates a gate layer 420 formed on a thin insulative layer 410 on a silicon substrate 400. In one embodiment, the gate layer 420 can be polysilicon. In one embodiment, the gate layer 420 is less than 0.20 $\mu$m in width. These structures are formed using conventional deposition and etching techniques well-known in the art.

Figure 4B:
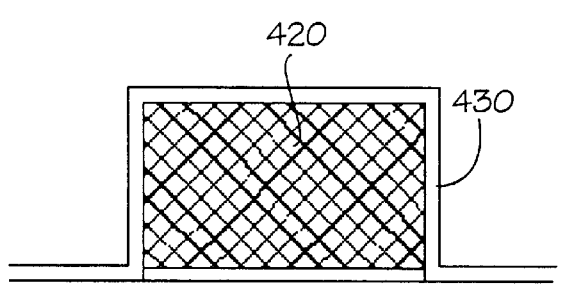

In FIG. 4b, a thin first spacer layer 430 is deposited or grown on the gate layer 420 and substrate 400. In one embodiment, the thin first spacer layer 430 can be an oxide. In one embodiment, the thin first spacer layer 430 is deposited or grown to a thickness in the range of approximately 50–300 Å, for example, 100 Å. It should be noted that the thin first spacer layer 430 can be deposited or grown using deposition techniques that are well known in the art and are not described in detail herein.

Figure 4C:
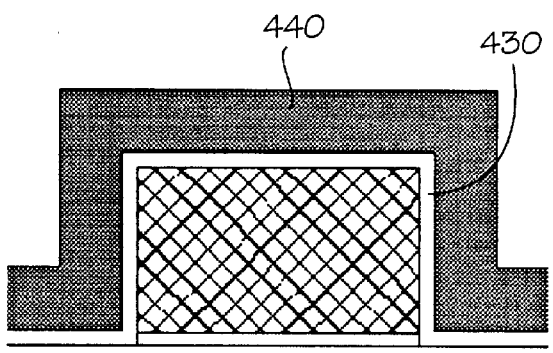

In FIG. 4c, a thick second spacer layer 440 is deposited or grown on the thin first spacer layer 430. In one embodiment, the thick second spacer layer 440 can be a nitride. In one embodiment, the thick second spacer layer 440 can be deposited or grown to a thickness in the range of approximately 300–2000 Å, for example, 800 Å. It should be noted that the thick second spacer layer 440 can be deposited or grown using deposition techniques that are well known in the art and are not described in detail herein.

Figure 4D:
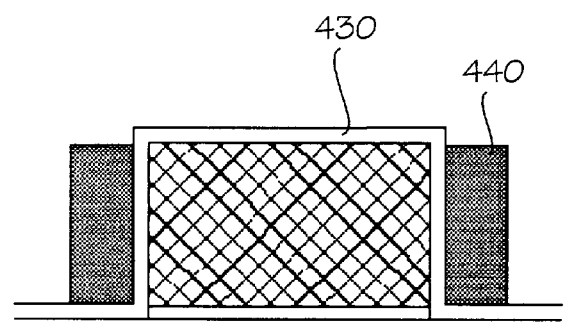

The thick second spacer layer 440 is etched a first time to form the structure illustrated in FIG. 4d. In one embodiment, this etch is an anisotropic (directional) etch which will remove nitride, but not oxide. Examples of anisotropic etches are a dry etch or a plasma etch.

Figure 4E:
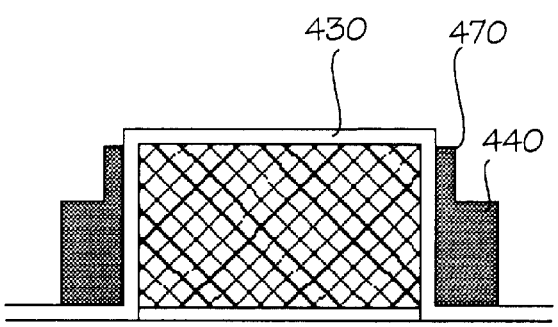

The thick second spacer layer 440 is then partially recessed by etching a second time to form the spacer structure illustrated in FIG. 4e. In one embodiment, the partial recess creates a thin second spacer wall 470 adjacent to the thin first spacer layer 430. In one embodiment, the thin second spacer wall 470 can be in the range of approximately 50–200 Å, for example, 100 Å, in width and can extend approximately 60 nm deeper than the surface level of the gate layer 420. In one embodiment, this etch is an anisotropic (directional) etch which will remove nitride, but not oxide. Examples of anisotropic etches are a dry etch or a plasma etch.

Figure 4F:
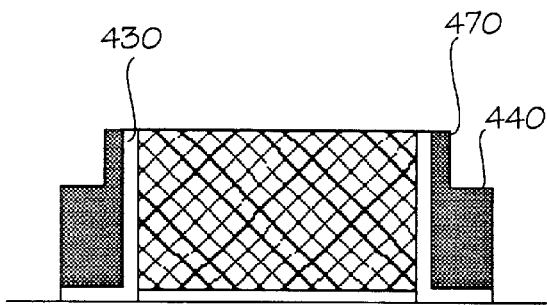

Following the partial recessing of the thick second spacer layer 440, the thin first spacer layer 430 is etched to form the spacer structure illustrated in FIG. 4f. In one embodiment, this etch is an isotropic (multidirectional) etch which will remove oxide, but not nitride. Examples of isotropic etches are a dry, wet or chemical bath etch.

Figure 4G:
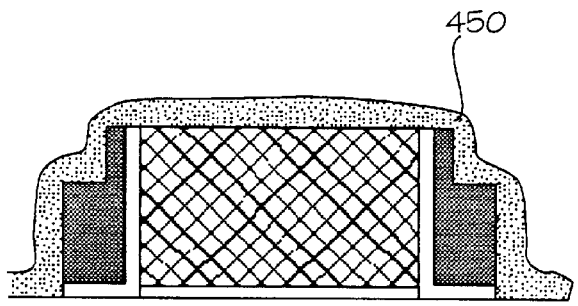

In FIG. 4g, a reactant layer 450 is deposited, for example, by sputter, electron beam evaporation, chemical vapor, or plasma deposition. In one embodiment, the reactant layer 450 can be a metal, such as titanium.

Figure 4H:
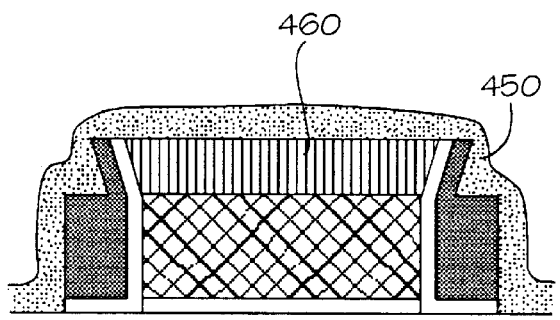

The reactant layer 450 and the gate layer 420 are then annealed to form a conductive layer 460 as shown in FIG. 4h. In one embodiment, the conductive layer 460 can be a polycide, such as titanium salicide. A polycide may also be called a polysilicide. It should be noted that silicides can be self-aligning or non-self-aligning, and if the silicide is self-aligning, it may be called a salicide. It is to be understood by one of ordinary skill in the art that polycides, other than self-aligning silicides, may also be formed. In one embodiment, the anneal may be performed using a rapid thermal annealing process in a nitrogen ambient. In one embodiment, additional anneals can be performed to decrease the resistance of the conductive layer 460. It is to be noted that the conductive layer 460 can now extend beyond the edges of the gate layer 420 due to flexibility in the thin spacer walls formed from the thin first spacer layer 430 and the thin second spacer walls 470.

Figure 4I:
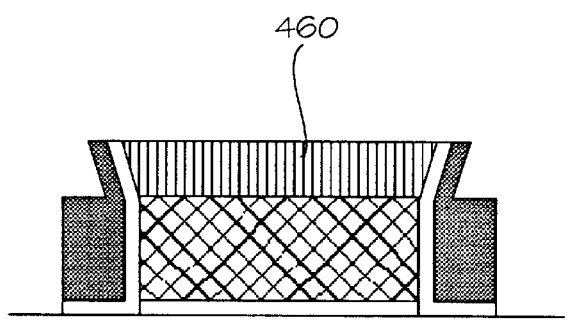

The unreacted portion of reactant layer 450 is etched away leaving the conductive layer 460 as illustrated in FIG. 4i. In one embodiment, this etch is an isotropic etch which will remove unreacted titanium, but not titanium salicide.

Figure 5A:
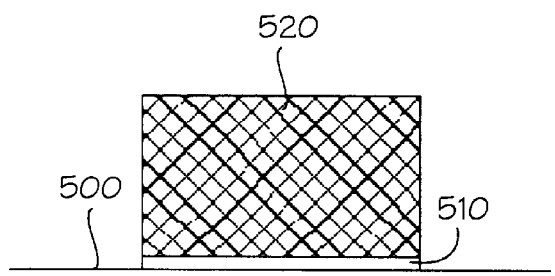

Another embodiment of the present invention is illustrated in FIGS. 5a–m. FIG. 5a illustrates a gate layer 520 formed on a thin insulative layer 510 on a substrate 500. In one embodiment, the gate layer 520 can be polysilicon. In one embodiment, the polysilicon gate layer 520 is less than 0.20 $\mu$m in width. These structures are formed using conventional deposition and etching techniques well-known in the art.

Figure 5B:
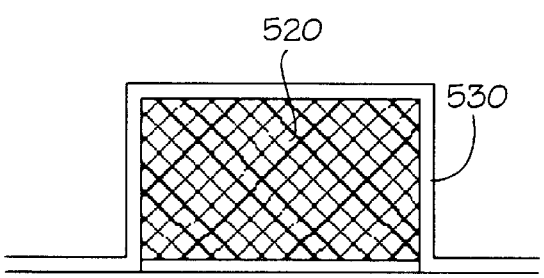

In FIG. 5b, a thin first spacer layer 530 is deposited or grown on the gate layer 520 and substrate 500. In one embodiment, the thin first spacer layer 530 can be an oxide. In one embodiment, the thin first spacer layer 530 is deposited or grown to a thickness in the range of approximately 50–150 Å, for example, 50 Å. It should be noted that the thin first spacer layer 530 can be deposited or grown using deposition techniques that are well known in the art and are not described in detail herein.

Figure 5C:
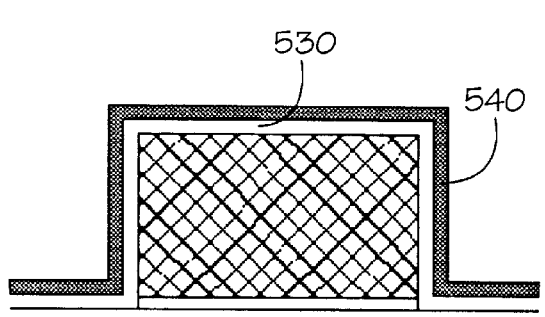

In FIG. 5c, a thin second spacer layer 540 is deposited or grown on the thin first spacer layer 530. In one embodiment, the thin second spacer layer 540 can be a nitride. In one embodiment, the thin second spacer layer 540 can be deposited or grown to a thickness in the range of approximately 50–150 Å, for example, 50 Å. It should be noted that the thin second spacer layer 540 can be deposited or grown using deposition techniques that are well known in the art and are not described in detail herein.

Figure 5D:
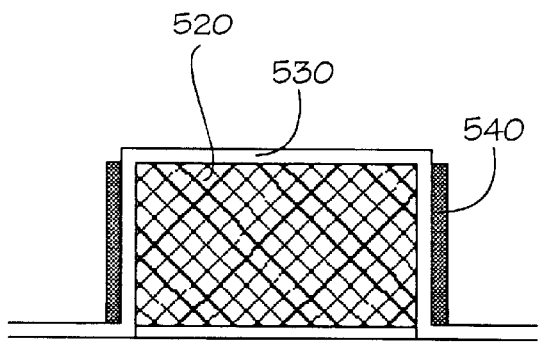

The thin second spacer layer 540 is etched a first time to form the structure illustrated in FIG. 5d. In one embodiment, this etch is an anisotropic (directional) etch which will remove nitride, but not oxide. Examples of anisotropic etches are a dry etch or a plasma etch.

Figure 5E:
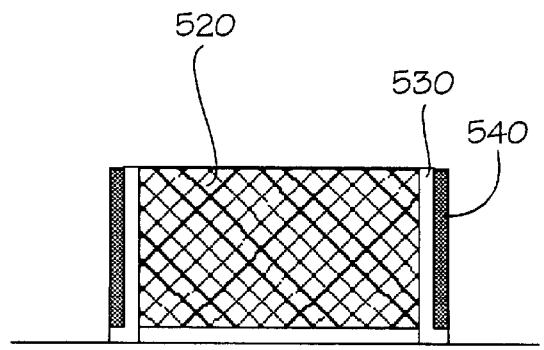

Following the etch of the thin second spacer layer 540, the thin first spacer layer 530 is etched to form the structure illustrated in FIG. 5e. In one embodiment, this etch is an isotropic (multidirectional) which will remove oxide, but not nitride. Examples of isotropic etches are dry or wet etches. It should be further noted that at this point in a process flow, implants of dopants can be added to the structure to enhance circuit performance.

Figure 5F:
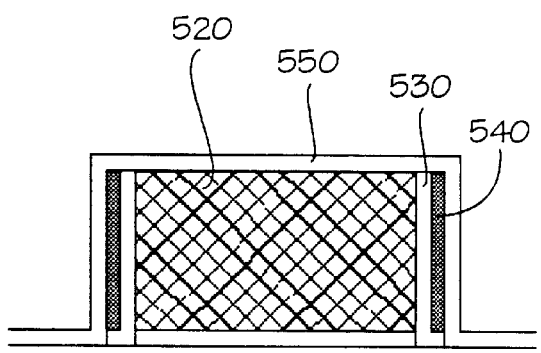

In FIG. 5f, a thin third spacer layer 550 is deposited or grown. In one embodiment, the thin third spacer layer 550 can be an oxide. In one embodiment, the thin third spacer layer 550 is deposited or grown to a thickness in the range of approximately 50–300 Å, for example, 100 Å. It should be noted that the thin third spacer layer 550 can be deposited or grown using deposition techniques that are well known in the art and are not described in detail herein.

Figure 5G:
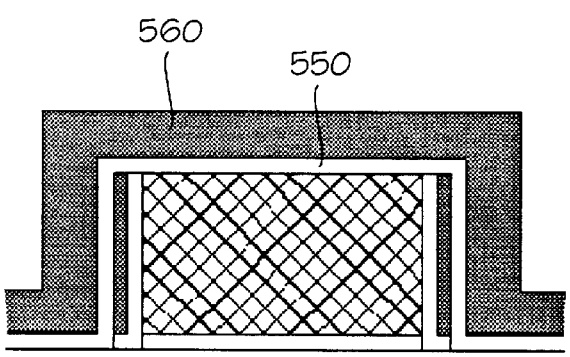

In FIG. 5g, a thick fourth spacer layer 560 is deposited or grown on the thin third spacer layer 550. In one embodiment, the thick fourth spacer layer 560 can be a nitride. In one embodiment, the thick fourth spacer layer 560 is deposited or grown to a thickness in the range of approximately 300–2000 Å, for example, 800 Å. It should be noted that the thick fourth spacer layer 560 can be deposited or grown using deposition techniques that are well known in the art and are not described in detail herein.

Figure 5H:
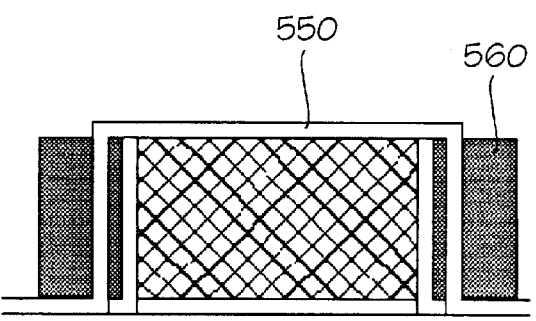

The thick fourth spacer layer 560 is etched a first time to form the structure illustrated in FIG. 5h. In one embodiment, this etch is an anisotropic (directional) etch which will remove nitride, but not oxide. Examples of anisotropic etches are a dry etch or a plasma etch.

Figure 5I:
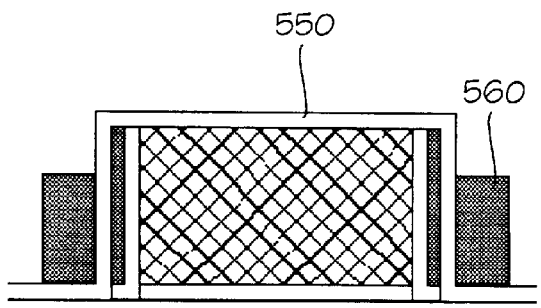

The thick fourth spacer layer 560 is then recessed by etching a second time to form the spacer structure illustrated in FIG. 5i. In one embodiment, the thick fourth spacer layer 560 is etched approximately 60 nm deeper than the surface level of the gate layer 520. In one embodiment, this etch is an isotropic (multidirectional) etch which will remove nitride, but not oxide. Examples of isotropic etches are wet or dry etches.

Figure 5J:
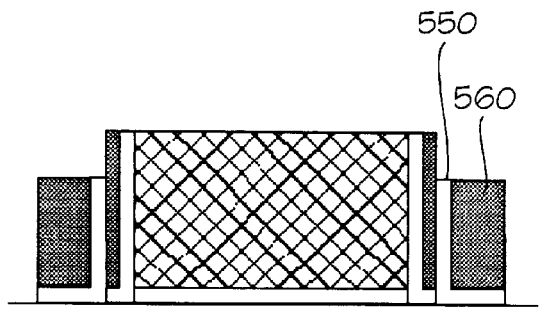

The thin third spacer layer 550 is then recessed by etching to form the spacer structure illustrated in FIG. 5j. In one embodiment, this etch is an isotropic (multidirectional) etch which will remove oxide, but not nitride. Examples of isotropic etches are a dry, wet or chemical bath etch.

Figure 5K:
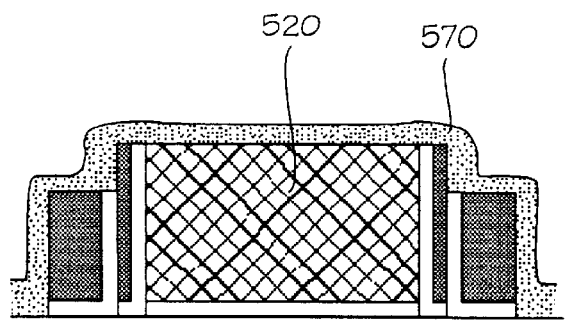

In FIG. 5k, a reactant layer 570 is deposited, for example, by sputter, electron beam evaporation, chemical vapor, or plasma deposition. In one embodiment, the reactant layer 570 can be a metal such as titanium.

Figure 5L:
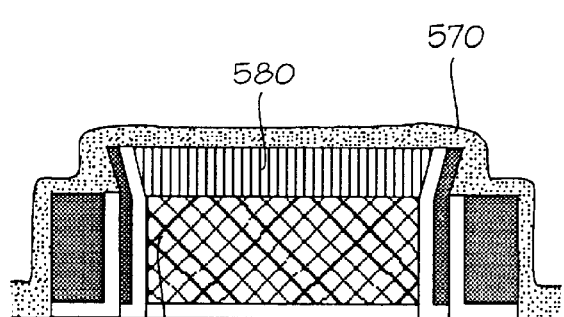

The reactant layer 570 and the gate layer 520 are then annealed to form a conductive layer 580 as shown in FIG. 5l. In one embodiment, the conductive layer 580 can be a polycide, such as titanium salicide. A polycide may also be called a polysilicide. It should be noted that silicides can be self-aligning or non-self-aligning, and if the silicide is self-aligning, it may be called a salicide. It is to be understood by on of ordinary skill in the art that polycides, other than self-aligning suicides, may also be formed. In one embodiment, the anneal may be performed using a rapid thermal annealing process in a nitrogen ambient. In one embodiment, additional anneals can be performed to decrease the resistance of the conductive layer 580. It is to be noted that the conductive layer 580 can now extend beyond the edges of the gate layer 520 due to flexibility in the thin spacer walls formed from the thin first spacer layer 530 and the thin second spacer layer 540.

Figure 5M:
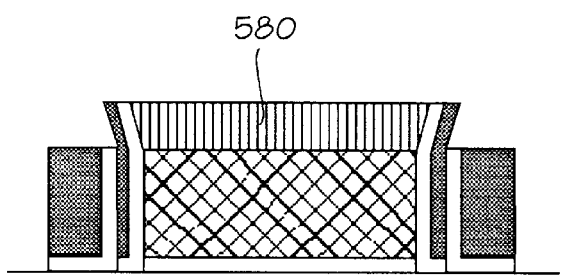

The unreacted reactant layer 570 is etched away leaving the conductive layer 580 as illustrated in FIG. 5m. In one embodiment, this etch is an isotropic etch which will remove unreacted titanium, but not titanium salicide.

Another embodiment of the present invention is illustrated in FIGS. 6a–p. FIG. 6a illustrates a gate layer 620 formed on a thin insulative layer 610 on a substrate 600. In one embodiment, the gate layer 620 can be polysilicon. In one embodiment, the gate layer 620 is less than 0.20 μm in width. These structures are formed using conventional deposition and etching techniques well-known in the art.

In FIG. 6b, a thin first spacer layer 630 is deposited or grown on the gate layer 620 and substrate 600. In one embodiment, the thin first spacer layer 630 can be an oxide. In one embodiment, the thin first spacer layer 630 is deposited or grown to a thickness in the range of approximately 50–150 Å, for example, 50 Å. It should be noted that the thin first spacer layer 630 can be deposited or grown using deposition techniques that are well known in the art and are not described in detail herein.

In FIG. 6c, a thin second spacer layer 640 is deposited or grown on the thin first spacer layer 630. In one embodiment, the thin second spacer layer 640 can be a nitride. In one embodiment, the thin second spacer layer 640 can be deposited or grown to a thickness in the range of approximately 50–150 Å, for example, 50 Å. It should be noted that the thin second spacer layer 640 can be deposited or grown using deposition techniques that are well known in the art and are not described in detail herein.

The thin second spacer layer 640 is etched a first time to form the structure illustrated in FIG. 6d. In one embodiment, this etch is an anisotropic (directional) etch which will remove nitride, but not oxide. Examples of anisotropic etches are a dry etch or a plasma etch.

Following the etch of the thin second spacer layer 640, the thin first spacer layer 630 is etched to form the structure illustrated in FIG. 6e. In one embodiment, this etch is an isotropic (multidirectional) which will attack oxide, but not nitride. Examples of isotropic etches are a dry, wet or chemical bath etch. It should be further noted that at this point in a process flow, implants of dopants can be added to the structure to enhance circuit performance.

In FIG. 6f, a thin third spacer layer 650 is deposited or grown. In one embodiment, the thin third spacer layer 650 can be an oxide. In one embodiment, the thin third spacer layer 650 is deposited or grown to a thickness in the range of approximately 50–300 Å, for example 100 Å. It should be noted that the thin third spacer layer 650 can be deposited or grown using deposition techniques that are well known in the art and are not described in detail herein.

In FIG. 6g, a thick fourth spacer layer 660 is deposited or grown on the thin third spacer layer 650. In one embodiment, the thick fourth spacer layer 660 can be a nitride. In one embodiment, the thick fourth spacer layer 660 is deposited or grown to a thickness in the range of approximately 300–2000 Å, for example, 800 Å. It should be noted that the thick fourth spacer layer 660 can be deposited or grown using deposition techniques that are well known in the art and are not described in detail herein The thick fourth spacer layer 660 is etched a first time to form the structure illustrated in FIG. 6h. In one embodiment, this etch is an anisotropic (directional) etch which will remove nitride, but not oxide. Examples of anisotropic etches are a dry etch or a plasma etch.

The thick fourth spacer layer 660 is then recessed by etching a second time to form the spacer structure illustrated in FIG. 6i. In one embodiment, the thick fourth spacer layer 660 is etched approximately 60 nm deeper than the surface level of the gate layer 620. In one embodiment, this etch is an isotropic (multidirectional) etch which will remove nitride, but not oxide. Examples of isotropic etches are a wet or dry etch.

The thin third spacer layer 650 is then recessed by etching to form the spacer structure illustrated in FIG. 6j. In one embodiment, this etch is an isotropic (multidirectional) etch which will remove oxide, but not nitride. Examples of isotropic etches are dry or wet etches.

At this point, further etches are still to be performed, however, the substrate 600 is left exposed. Thus, if a following etch chemistry is utilized which can remove the substrate 600, the substrate 600 will need to be protected. Thus, a protective layer, for example, an oxide layer, can be provided. The provision of a protective layer is described together with the figures that follow. Alternatively, if a following etch chemistry does not remove the substrate 600, then the process can continue without the necessity of providing and removing a protective layer.

In FIG. 6k, a thin protective layer 670 is deposited or grown on the substrate 600. In one embodiment, the thin protective layer 670 can be oxide. In one embodiment, the thin protective layer 670 is deposited or grown to a thickness in the range of approximately 50–300 Å, for example, 50 Å. In one embodiment, the thin protective layer 670 can be an oxide grown by annealing a silicon substrate 600 in an oxygen ambient.

The thin second spacer layer 640 is recessed by etching to form the spacer structure illustrated in FIG. 6l. In one embodiment, this etch is an anisotropic (directional) etch which will remove nitride, but not oxide. Examples of anisotropic etches are a dry etch or a plasma etch.

The thin protective layer 670 is removed and the thin first spacer layer 630 recessed by etching a second time to form the spacer structure illustrated in FIG. 6m. In one embodiment, the thin first spacer layer 630 is recessed approximately 60 nm deeper than the surface level of the gate layer 620. In one embodiment, this etch is an isotropic (multidirectional) etch which will remove oxide, but not nitride. Examples of isotropic etches are a wet, dry or chemical bath etch. It should be noted that the side walls of the gate layer 620 are now exposed creating a larger contact (reaction) surface area.

In FIG. 6n, a reactant layer 680 is deposited, for example, by sputter, electron beam evaporation, chemical vapor, or plasma deposition. In one embodiment, the reactant layer 680 can be a metal, such as titanium.

The reactant layer 680 and the gate layer 620 are then annealed to form a conductive layer 690 as shown in FIG. 6o. In one embodiment, the conductive layer 690 can be a polycide, such as titanium salcide. A polycide may also be called a polysilicide. It should be noted that silicides can be self-aligning or non-self-aligning, and if the silicide is self-aligning, it may be called a salicide. It is to be understood by one of ordinary skill in the art that polycides, other than self-aligning silicides, may also be formed. In one embodiment, the anneal may be performed using a rapid thermal annealing process in a nitrogen ambient. In one embodiment, additional anneals can be performed to decrease the resistance of the conductive layer 690. It is to be noted that the conductive layer 690 can now extend beyond the edges of the gate layer 620 and is not constrained and stressed.

The unreacted reactant layer 680 is etched away leaving the conductive layer 690 as illustrated in FIG. 6p. In one embodiment, this etch is an isotropic etch which will remove unreacted titanium, but not titanium salicide.

Through out the specification, reference has been made to isotropic and anisotropic etching. It should be noted that the present invention may be performed using these etch processes interchangeably, however, such interchanging of etch processes may cause other complications. The process steps as defined above are the preferred manner in which to perform the present invention.

Additionally, throughout the specification, it has been stated that the etch processes remove only the nitride or oxide layers, however, it should be noted that such etch processes selectively remove the nitride or oxide. In other words, an etch to remove nitride will remove nitride at a faster rate than oxide, such that more nitride is removed and very little oxide is removed; and, an etch to remove oxide will remove oxide at a faster rate than nitride, such that more oxide is removed and very little nitride is removed.

The above described embodiments of the method and device of the present invention provide improved polycide resistance in polysilicon gate widths below 0.20 $\mu$m. As earlier described, conductive layers, such as the polycide, titanium salicide, can expand during formation. Previous gate electrode structures had spacer structures which constrained this expansion. This led to a stressed conductive layer that exhibited increased resistance. The several embodiments of the present invention, reduce the stress on the formed conductive layer thereby improving the resistance. In some embodiments, spacers are recessed to remove constraints on the expansion of the conductive layer. In other embodiments, spacers are partially recessed to provide thin spacer walls which flex to dissipate stress. In other embodiments, dual spacer stacks that are recessed and partially recessed also provide dissipate or remove stress on the conductive layer. It is this reduction in the stress by the several embodiments of the present invention, that provides improved resistance. Also, in several of the embodiments the side walls of the gate layer are exposed to allow greater surface area. This aids in formation of the conductive layer by providing for increased nucleation sites. By aiding in formation of the conductive layer, process yields increase.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method comprising:
   providing a substrate with an insulative layer deposited thereon;
   forming a gate layer on the insulative layer;
   depositing a thin first spacer layer on the gate layer and the substrate;

depositing a thick second spacer layer on the thin first spacer layer;

removing a portion of the thick second spacer layer to form partially recessed thick second spacers, said partially recessed thick second spacers comprising a thin second spacer wall adjacent to said then first spacer layer;

removing a portion of the thin first spacer layer to form thin first spacers;

depositing a layer of reactant on the gate layer;

annealing the layer of reactant and the gate layer to form a conductive layer; and removing the unreacted reactant layer.

2. The method of claim 1 wherein removing a portion of the thick second spacer layer to form partially recessed thick second spacers comprises:

removing a second portion of the thick second spacer layer by anisotropic etching.

3. The method of claim 2 wherein removing a portion of the thin first spacer layer to form thin first spacers comprises isotropic etching.

4. The method of claim 3 wherein the insulative layer is an oxide.

5. The method of claim 4 wherein the gate layer is a polysilicon.

6. The method of claim 5 wherein the reactant is a metal.

7. The method of claim 6 wherein said thin first spacer layer is an oxide.

8. The method of claim 7 wherein said thick second spacer layer is a nitride.

9. The method of claim 8 wherein the conductive layer is a polycide.

10. The method of claim 9 wherein the metal is titanium.

11. The method of claim 10 wherein the polycide is titanium salicide ($TiSi_2$).

* * * * *

UNITED STATES PATENT AND TRADEMARK OFFICE
CERTIFICATE OF CORRECTION

PATENT NO. : 6,251,762 B1
DATED : June 26, 2001
INVENTOR(S) : Jan et al.

It is certified that error appears in the above-identified patent and that said Letters Patent is hereby corrected as shown below:

<u>Column 4,</u>
Line 22, delete "salice" and insert -- salicide --.

<u>Column 9,</u>
Line 63, delete "salcide" and insert -- salicide --.

Signed and Sealed this

Fourth Day of June, 2002

*Attest:*

JAMES E. ROGAN
*Attesting Officer*   *Director of the United States Patent and Trademark Office*